United States Patent
Weber et al.

(10) Patent No.: US 6,810,492 B2
(45) Date of Patent: *Oct. 26, 2004

(54) APPARATUS AND SYSTEM FOR RECOVERY OF USEFUL AREAS OF PARTIALLY DEFECTIVE DIRECT RAMBUS RIMM COMPONENTS

(75) Inventors: Richard R. Weber, Boise, ID (US); Corey L. Larsen, Marsing, ID (US); James J. Howarth, Marsing, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/430,851

(22) Filed: May 6, 2003

(65) Prior Publication Data

US 2003/0196134 A1 Oct. 16, 2003

Related U.S. Application Data

(63) Continuation of application No. 09/519,641, filed on Mar. 6, 2000, now Pat. No. 6,578,157.

(51) Int. Cl.[7] .................................................. G06F 11/00
(52) U.S. Cl. ............................... 714/8; 714/7; 714/710
(58) Field of Search ............................... 714/7, 8, 710; 711/5, 170

(56) References Cited

U.S. PATENT DOCUMENTS 3,714,637 A    1/1973   Beausoleil
3,715,735 A    2/1973   Moss
3,735,368 A    5/1973   Beausoleil
3,772,652 A    11/1973  Hilberg
3,781,826 A    12/1973  Beausoleil
3,800,294 A    3/1974   Lawlor (List continued on next page.)

OTHER PUBLICATIONS

Malik, Om; "Rambus: It finally works!"; Oct. 11, 1999; Forbes.com; http://www.forbes.com/1999, 10,11, mu8.html.*

Shanley, Tom, et al., *ISA System Architecture, 3rd Ed.*, pp. 126–132 & 221–232, 1995.

Intel, *PC SDRAM Unbuffered DIMM Specification, Revision 1.0*, Feb. 1998.

Intel, *PC SCRAM Specification, Revision 1.63*, Oct. 1998.

Pending Patent Application "System for Remapping Defective Memory Bit Sets" (without claims or abstract), Ser. No. 08/903,819, filed Jul. 31, 1997.

(List continued on next page.)

*Primary Examiner*—Scott Baderman
*Assistant Examiner*—Joshua Lohn
(74) *Attorney, Agent, or Firm*—TraskBritt (57) ABSTRACT

A memory module using a plurality of partially defective RDRAM devices in combination to simulate a single, fully operational RDRAM device. Multiple, partially defective RDRAM devices are configured to simulate a fully operational RDRAM device by taking advantage of the manner in which defective cells are localized on each RDRAM device.

14 Claims, 5 Drawing Sheets

U.S. PATENT DOCUMENTS

| | | |
|---|---|---|
| 3,845,476 A | 10/1974 | Boehm |
| 4,355,376 A | 10/1982 | Gould |
| 4,376,300 A | 3/1983 | Tsang |
| 4,450,560 A | 5/1984 | Conner |
| 4,475,194 A | 10/1984 | LaVallee et al. |
| 4,479,214 A | 10/1984 | Ryan |
| 4,493,075 A | 1/1985 | Anderson et al. |
| 4,527,251 A | 7/1985 | Nibby, Jr. et al. |
| 4,646,299 A | 2/1987 | Schinabeck et al. |
| 4,807,191 A | 2/1989 | Flannagan |
| 4,837,747 A | 6/1989 | Dosaka et al. |
| 4,876,685 A | 10/1989 | Rich |
| 4,881,200 A | 11/1989 | Urai |
| 4,908,798 A | 3/1990 | Urai |
| 4,918,662 A | 4/1990 | Kondo |
| 4,935,899 A | 6/1990 | Morigami |
| 4,992,984 A | 2/1991 | Busch et al. |
| 5,051,994 A | 9/1991 | Bluethman et al. |
| 5,060,197 A | 10/1991 | Park et al. |
| 5,070,502 A * | 12/1991 | Supnik .......................... 714/8 |
| 5,124,948 A | 6/1992 | Takizawa et al. |
| 5,126,973 A | 6/1992 | Gallia et al. |
| 5,134,584 A | 7/1992 | Boler et al. |
| 5,200,959 A | 4/1993 | Gross et al. |
| 5,208,775 A | 5/1993 | Lee |
| 5,233,614 A | 8/1993 | Singh |
| 5,243,570 A | 9/1993 | Saruwatari |
| 5,251,174 A | 10/1993 | Hwang |
| 5,268,866 A | 12/1993 | Feng et al. |
| 5,270,974 A | 12/1993 | Reddy |
| 5,270,976 A | 12/1993 | Tran |
| 5,315,552 A | 5/1994 | Yoneda |
| 5,327,380 A | 7/1994 | Kersh, III et al. |
| 5,332,922 A | 7/1994 | Oguchi et al. |
| 5,337,277 A | 8/1994 | Jang |
| 5,349,556 A | 9/1994 | Lee |
| 5,371,866 A | 12/1994 | Cady |
| 5,379,415 A | 1/1995 | Papenberg et al. |
| 5,390,129 A | 2/1995 | Rhodes |
| 5,392,247 A | 2/1995 | Fujita |
| 5,400,263 A | 3/1995 | Rohrbaugh et al. |
| 5,400,342 A | 3/1995 | Matsumura et al. |
| 5,406,565 A | 4/1995 | MacDonald |
| 5,410,545 A | 4/1995 | Porter et al. |
| 5,424,989 A | 6/1995 | Hagiwara et al. |
| 5,434,792 A | 7/1995 | Saka et al. |
| 5,465,234 A | 11/1995 | Hannai |
| 5,469,390 A | 11/1995 | Sasaki et al. |
| 5,475,648 A | 12/1995 | Fujiwara |
| 5,475,695 A | 12/1995 | Caywood et al. |
| 5,491,664 A | 2/1996 | Phelan |
| 5,497,381 A | 3/1996 | O'Donoghue et al. |
| 5,502,333 A | 3/1996 | Bertin et al. |
| 5,513,135 A | 4/1996 | Dell et al. |
| 5,513,327 A | 4/1996 | Farmwald et al. |
| 5,528,553 A | 6/1996 | Saxena |
| 5,535,328 A | 7/1996 | Harari et al. |
| 5,539,697 A | 7/1996 | Kim et al. |
| 5,544,106 A | 8/1996 | Koike |
| 5,548,553 A | 8/1996 | Cooper et al. |
| 5,553,231 A | 9/1996 | Papenberg et al. |
| 5,576,999 A | 11/1996 | Kim et al. |
| 5,588,115 A | 12/1996 | Augarten |
| 5,600,258 A | 2/1997 | Graham et al. |
| 5,602,987 A | 2/1997 | Harari et al. |
| 5,631,868 A | 5/1997 | Termullo, Jr. et al. |
| 5,633,826 A | 5/1997 | Tsukada |
| 5,636,173 A | 6/1997 | Schaefer |
| 5,654,204 A | 8/1997 | Anderson |
| 5,668,763 A | 9/1997 | Fujioka et al. |
| 5,717,694 A | 2/1998 | Ohsawa |
| 5,734,621 A | 3/1998 | Ito |
| 5,745,673 A | 4/1998 | Di Zenzo et al. |
| 5,754,753 A | 5/1998 | Smelser |
| 5,758,056 A | 5/1998 | Barr |
| 5,768,173 A | 6/1998 | Seo et al. |
| 5,798,962 A | 8/1998 | Di Zenzo et al. |
| 5,841,710 A | 11/1998 | Larsen |
| 5,862,314 A | 1/1999 | Jeddeloh |
| 5,883,842 A * | 3/1999 | Miyauchi .................... 365/200 |
| 5,896,346 A | 4/1999 | Dell et al. |
| 5,913,020 A | 6/1999 | Rohwer |
| 5,920,512 A | 7/1999 | Larsen |
| 5,920,513 A | 7/1999 | Jacobson |
| 5,956,233 A | 9/1999 | Yew et al. |
| 5,966,724 A | 10/1999 | Ryan |
| 5,970,008 A | 10/1999 | Zagar et al. |
| 5,974,564 A | 10/1999 | Jeddeloh |
| 6,009,536 A | 12/1999 | Rohwer |
| 6,035,432 A | 3/2000 | Jeddeloh |
| 6,314,527 B1 | 11/2001 | Weber et al. |
| 6,530,007 B2 * | 3/2003 | Olarig et al. ............... 711/167 |
| 6,578,157 B1 * | 6/2003 | Weber et al. .................. 714/8 |
| 2003/0014688 A1 * | 1/2003 | Wu .............................. 714/7 |

OTHER PUBLICATIONS

Pending Patent Application "Recovery of Useful Areas of Partially Defective Synchronous Memory Components" (without claims or abstract), Ser. No. 09/035,624, filed Mar. 5, 1998.

Pending Patent Application "Automated Multi–Chip Module Handler, Method of Module Handling, and Module Magazine" (without claims or abstract), Ser. No. 09/065,799, Filed Apr. 23, 1998.

Pending Patent Application "Method for Recovery of Useful Areas of Partially Defective Synchronous Memory Components" (without claims or abstract), Ser. No. 09/035,739, filed Mar. 5, 1998.

Pending Patent Application "A System for Decoding Addresses for a Defective Memory Array" (without claims or abstract), Ser. No. 09/067,347, filed Apr. 28, 1998.

Pending Patent Application "A Method for Decoding Addresses for a Defective Memory Array" (without claims or abstract), Ser. No. 09/067,467, filed Apr. 28, 1998.

Pending Patent Application "Use of Partially Dysfunctional Memory Devices" (without claims or abstract), Ser. No. 09/217,781, filed Dec. 21, 1998.

* cited by examiner

APPARATUS AND SYSTEM FOR RECOVERY OF USEFUL AREAS OF PARTIALLY DEFECTIVE DIRECT RAMBUS RIMM COMPONENTS

CROSS-REFERENCE TO RELATED APPLICATION

This application is a continuation of application Ser. No. 09/519,641, filed Mar. 6, 2000, now U.S. Pat. No. 6,578,157, issued Jun. 10, 2003.

BACKGROUND OF THE INVENTION

1. Field of the Invention

The present invention relates generally to the use of partially defective direct Rambus DRAM ("RDRAM") chips. More particularly, the present invention relates to the recovery of RDRAM components that do not have all memory areas accessible by appropriately configuring a plurality of the defective RDRAM components to simulate the operation of a fully operational RDRAM chip.

2. State of the Art

As is well known in the art, during the production of monolithic memory devices from silicon wafers, some of the memory storage cells can become unreliable or fail to function altogether. These defective cells can be the result of a number of causes such as impurities introduced in the process of manufacturing the monolithic memory device from the silicon wafer, or localized imperfections in the silicon substrate itself. As used herein, the term "silicon" is intended to encompass all semiconductor materials.

Often, while some memory cells are defective, many other cells on the same memory chip are not defective and will work reliably and accurately. Additionally, it is often the case that the defective cells are localized and confined to particular connections from the memory device. The remaining non-defective connections can be relied upon to provide a consistent and accurate representation of the information in the storage cell. Testing procedures well known in the art are performed to determine how many, and which, cells within a memory chip are good or accessible and how many, and which, are defective. In this way it can readily be determined and mapped which DQ connectors reliably send and receive accurate and valid data to and from which non-defective cells.

Techniques have been developed for salvaging the non-defective portions of defective asynchronous memory technologies (e.g., DRAM). Asynchronous memory technologies are relatively slow devices that operate in response to control signals generated by a memory controller, rather than in response to the system clock. The control signals allow the asynchronous memory device to operate at a speed that is much slower than the system clock, which ensures reliable read and write memory operations.

Techniques have also been developed for salvaging non-defective portions of some forms of synchronous memory technologies such as SDRAM. SDRAM devices are much faster than asynchronous devices principally because SDRAM is capable of synchronizing itself with the microprocessor's clock. This synchronization can eliminate the time delays and wait states often necessary with prior memory technologies (e.g., DRAM), and allows for fast, consecutive read and write capability.

Synchronous memory devices such as RDRAM include a data bus architecture which departs from the backplane bus architecture typical in prior DRAM and SDRAM systems. U.S. Pat. No. 5,513,327 (Farmwald et al.), the disclosure of which is hereby incorporated herein by reference, describes the differences in the structure and function of RDRAM versus prior art SDRAM and DRAM.

However, no attempts known to the inventors have been made to date to salvage non-defective portions of partially defective RDRAM devices. Some people skilled in the art believe that the use of known techniques for salvaging defective memory devices would not work to salvage RDRAM components because RDRAM operates at much higher speeds than previous memory devices (presently up to 800 Mb/s per pin or 1.6 GB/s per device).

BRIEF SUMMARY OF THE INVENTION

The present invention addresses the problem of salvaging partially defective RDRAM devices. In one embodiment of the present invention, a plurality of partially defective RDRAM devices is placed in a parallel configuration, assigned the same device ID numbers and substituted for a single non-defective RDRAM device during fabrication of a memory module to simulate that single non-defective RDRAM device. Defective DQ connectors may also be left unconnected to, or separated from, corresponding data lines such that each data line is only connected to one non-defective DQ connector of the plurality of partially defective RDRAM devices.

BRIEF DESCRIPTION OF THE SEVERAL VIEWS OF THE DRAWINGS

The nature of the present invention as well as other embodiments of the present invention may be more clearly understood by reference to the following detailed description of the invention, to the appended claims, and to the several drawings herein, wherein:

DETAILED DESCRIPTION OF THE INVENTION

Figure 1:
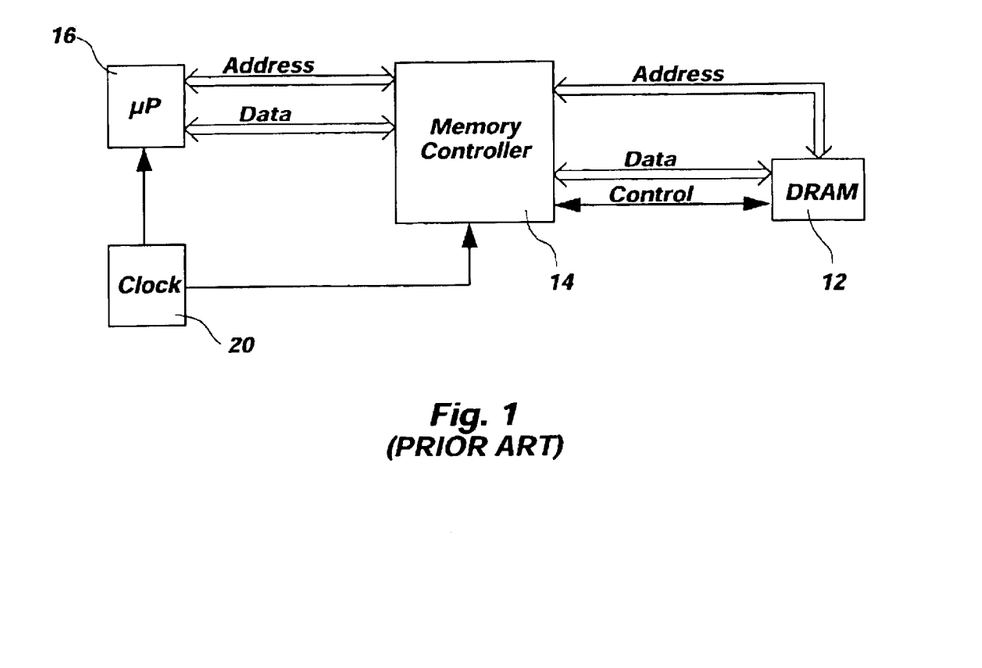
FIG. 1 is a block diagram of a prior art computer memory system using a wait state control device with DRAM memory chips.

FIG. 1 is a block diagram of a prior art computer memory system comprising a microprocessor 16, a memory controller 14, main memory 12, and a system clock 20. In the system shown, main memory 12 is made up of asynchronous dynamic random access memory ("DRAM"). As is well known in the art, due to differences in speed between the microprocessor 16 and the DRAM 12, it is often necessary to insert "wait states" when the microprocessor carries out a memory operation involving the DRAM 12. Typically, the DRAM 12 is slower than the microprocessor 16, so one or more additional wait states are added to the microprocessor's memory access cycle to ensure that the main memory 12 is given a sufficient amount of time to carry out the memory (read/write) operation.

In addition, the clock 20 in the system of FIG. 1 is not a direct input to the DRAM 12. Instead, as is well known in the art, control signals are derived from the clock, and the DRAM 12 is operated through the use of these control signals. The signals presented to the DRAM device 12 change relatively slowly compared to the rate at which the clock changes.

Figure 2:
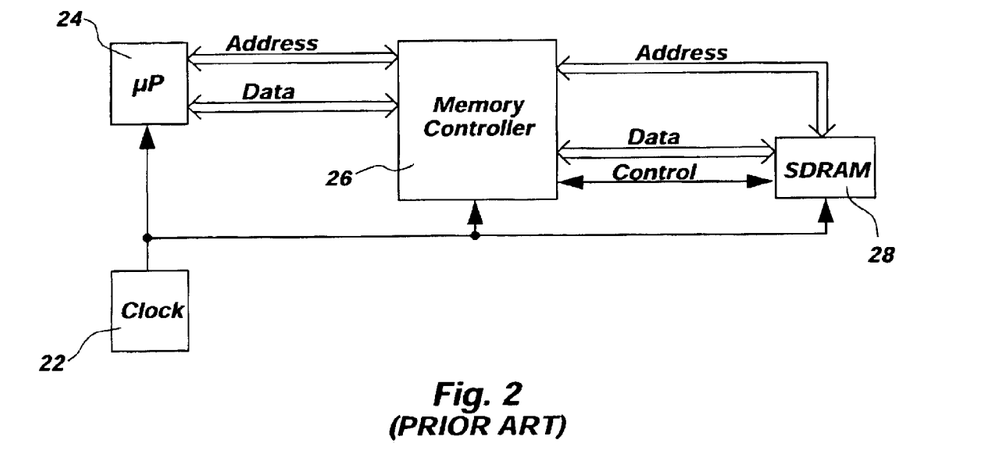
FIG. 2 is a block diagram of a prior art computer memory system employing SDRAM memory chips.

FIG. 2 depicts a block diagram of a prior art computer memory system comprising a clock 22, a microprocessor 24, a memory controller 26, and main memory 28 made of synchronous dynamic random access memory ("SDRAM"). Unlike the system of FIG. 1, the SDRAM 28 is synchronized with the clock 22. This synchronization is effective to eliminate some or all of the wait states normally necessary with DRAM devices, and it also allows for fast, consecutive read and write capability. Unlike FIG. 1, in FIG. 2 the clock 22 is provided as a direct input to the main memory 28.

Figure 3:
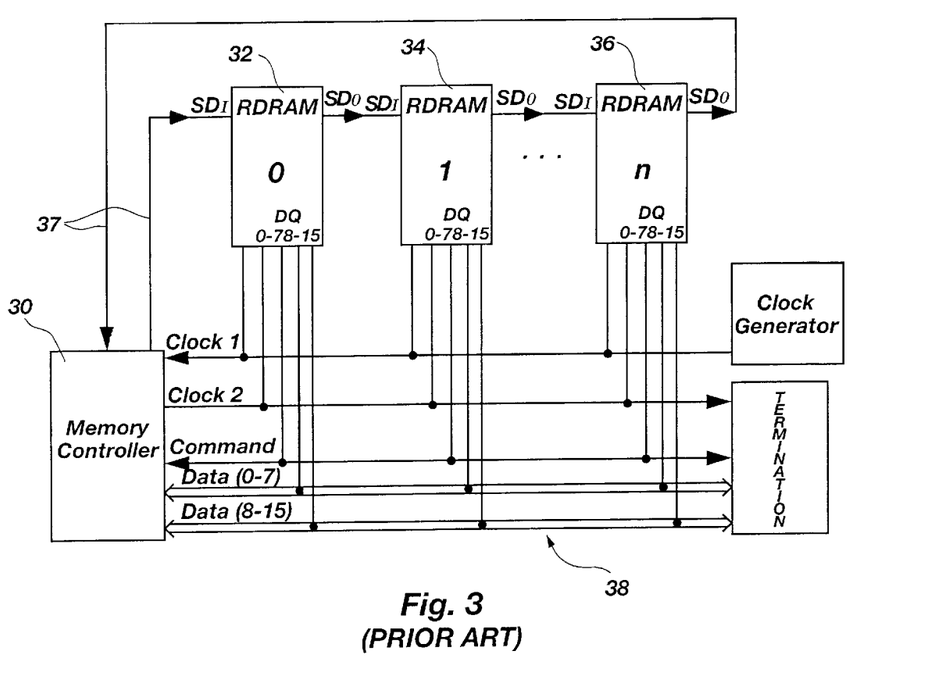
FIG. 3 is a block diagram of a prior art computer memory system employing RDRAM memory chips.

FIG. 3 depicts a block diagram of a prior art computer memory system comprising a memory controller 30 driving signals to and receiving signals from a plurality of RDRAM devices or chips 32, 34 and 36. The signals are communicated through a signal bus 38 comprising two clock signal lines, a command signal line and a plurality of data lines. As used herein, the term "data line" is not intended to be limited simply to the data lines found on the signal bus, but is intended to include any communication pathway which may lead to the signal bus and is intended for use in communicating data. A serial data line (SD) 37, which originates from and terminates to the memory controller 30, is coupled to each RDRAM device 32, 34 and 36 in series. The signal bus 38 is accessible by each RDRAM device 32, 34 and 36. Of particular interest in the configuration shown is that each RDRAM device 32, 34 and 36 is in communication with all of the available data lines on the signal bus 38.

One characteristic of RDRAM devices resulting, in part, from the unique bus architecture employed therein, is that each RDRAM device is a complete, independent memory subsystem. Each RDRAM device contains its own set of internal registers which preferably include a device identification ("device ID") register, a device-type descriptor register, control registers and other necessary information registers. These registers, or some equivalent of them, also specify the memory addresses contained within that particular RDRAM device.

Most of the registers can be modified and preferably are set as part of an initialization sequence which occurs when the system is powered-up or reset. During the initialization sequence, each RDRAM device 32, 34 and 36 of the system as shown in FIG. 3 is assigned a unique device ID number through the serial data line (SD) 37. The device ID number is stored in the respective device ID register for each RDRAM device 32, 34 and 36. The memory controller 30 can then use these device ID numbers to access the information within a specific RDRAM device. In operation, the memory controller 30 sends a request packet (a sequence of bytes comprising address and control information) to one or more of the RDRAM devices 32, 34 and 36 in communication with the signal bus 38. Each RDRAM device 32, 34 and 36 in communication with the signal bus 38 must then decode the request packet to see if that RDRAM device 32, 34 and 36 needs to respond to the request. The specific RDRAM device to which the request packet is directed may respond by returning one or more bytes (8 bits) of data on the signal bus 38 or by storing information available on the signal bus 38. In this way, the specific RDRAM device in which the requested address is located may access the appropriate address to retrieve or store data.

Figure 4:
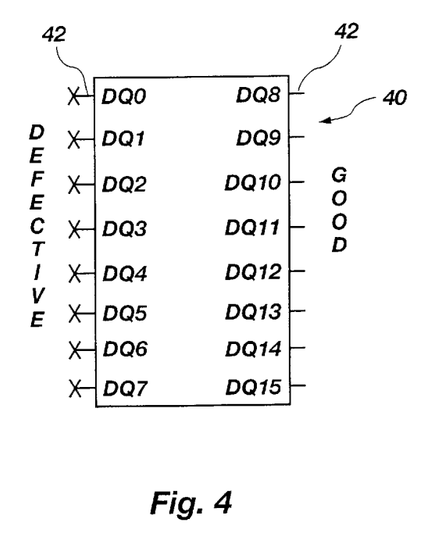
FIG. 4 is a block diagram of a partially defective RDRAM device.

FIG. 4 depicts a block diagram of a partially defective RDRAM device 40 comprising sixteen DQ connectors 42. Of the sixteen DQ connectors 42 in the RDRAM device 40 shown, eight are non-defective, meaning they consistently and reliably produce and receive valid or accurate data as determined by any of several testing procedures well known in the art. Which testing procedure is used depends upon the testing equipment used. Semiconductor testing equipment is manufactured and distributed by many companies including Schlumberger of San Jose, Calif., and Advent of Des Plaines. The "X" located beside each of DQ0–DQ7 indicates defective DQ connectors and is shown as being adjacent only for ease of explanation. It should be understood that the present invention does not require any particular arrangement for the defective or non-defective DQ connectors on a particular RDRAM device. For example, the defective DQ connectors could also be randomly distributed among the totality of the DQ connectors 42. The principle for using partially defective RDRAM in accordance with the invention is the same whether the defective DQ connectors are adjacent or randomly distributed. Any combination would be appropriate. Furthermore, the invention does not require that for each partially defective RDRAM device, the defective DQ connectors be arranged in the same or any particular order. It is preferable only that the non-defective DQ connectors be identifiable to avoid incorrect data transfer.

Figure 5:
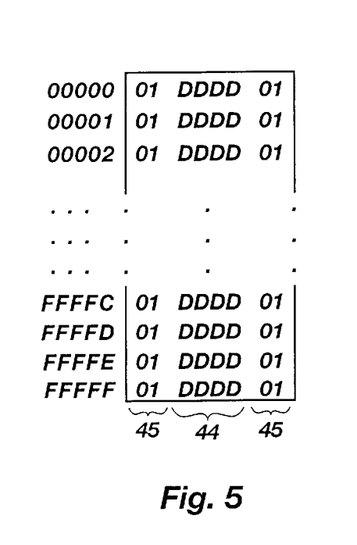
FIG. 5 is a memory map showing the localized nature of defective memory cells in one memory bank of an embodiment of the present invention.

FIG. 5 depicts a memory map showing the localized nature of defective memory cells in one memory bank of an embodiment of the present invention. The "D"s represent defective memory cells and the "01"s represent non-defective memory cells. As can be seen from FIG. 5, in the particular RDRAM device of FIG. 4, the defects 44 are such that every addressable 16 bit memory location has both reliable 45 and unreliable (or unused) portions, and they are consistently arranged within each addressable region. This result may follow from the nature of the defect, where certain DQ connectors always present valid data, whereas other DQ connectors may not be reliable and may occasionally present bad data. Defects in the silicon or impurities introduced in the chip fabrication process will often result in defects 44 like those illustrated in FIG. 5.

Figure 6:
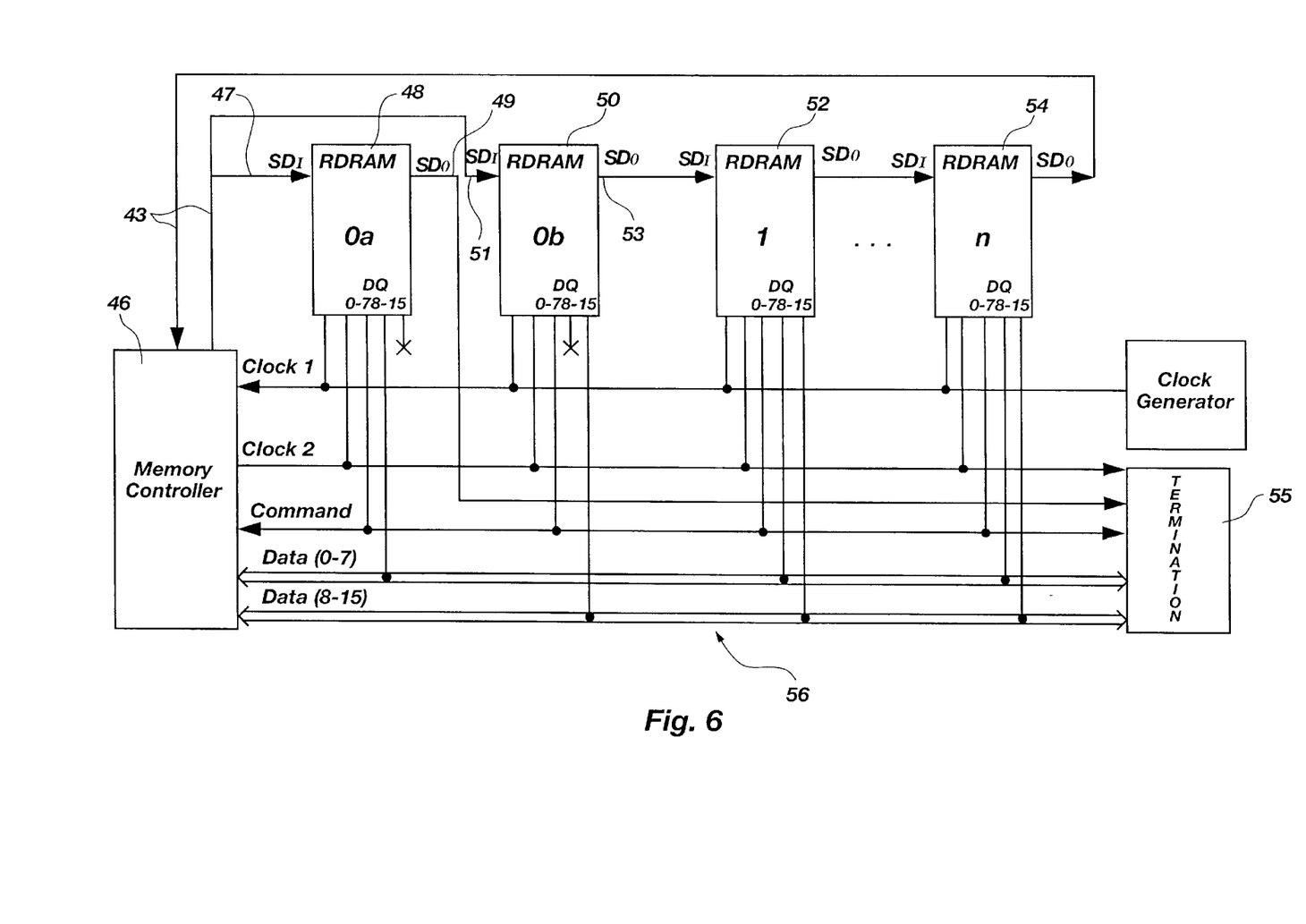
FIG. 6 is a block diagram of a computer memory system employing partially defective RDRAM devices in an embodiment of the present invention.

FIG. 6 depicts a block diagram of one embodiment of the present invention comprising a memory controller 46 driving signals to and receiving signals from a plurality of RDRAM devices 48, 50, 52 and 54, at least some of which are partially defective. As used herein, the term "partially defective" device means a device with at least some non-functional or non-addressable memory, while a "non-defective" or "fully operational" device is a device exhibiting at least the amount of addressable, functional memory for which the device was designed. Distinct from the system shown in FIG. 3, this embodiment of the invention includes two partially defective RDRAM devices 48 and 50. Each partially defective RDRAM device 48 and 50 used in the embodiment shown in FIG. 6 has at least 8 non-defective DQ connectors. The two partially defective RDRAM devices 48 and 50 are substituted for a single non-defective RDRAM device during fabrication of the RDRAM Rambus Inline Memory Module ("RIMM"). In other words, the two partially defective RDRAM devices 48 and 50 simulate and perform the function of a single non-defective RDRAM device in a non-defective RDRAM RIMM.

In the embodiment of FIG. 6, a first partially defective RDRAM device 0a 48 is placed in communication with data lines 0–7, and a second partially defective RDRAM device 0b 50 is placed in communication with data lines 8–15. In this way, each of the sixteen data lines is in communication with only one of the partially defective RDRAM devices 48 and 50. By coupling the serial data line (SD) 43 to the serial data inputs ($SD_I$) 47 and 51 of each of the two partially defective RDRAM devices 48 and 50 which are simulating the same non-defective RDRAM device, and coupling the serial data output ($SD_O$) 53 from only one of the two partially defective RDRAM devices 48 or 50 to the next sequential non-defective RDRAM device 52, each of the two partially defective RDRAM devices 48 and 50 are assigned the same device ID number during initialization. Because each RDRAM device 48, 50, 52 and 54 has its own registers and makes an individual assessment as to whether it needs to respond to a request packet detected on the signal bus 56, the two partially defective RDRAM devices 48 and 50, which otherwise would have been scrapped as defective, can be effectively used in combination to simulate a single non-defective RDRAM device. The serial data output ($SD_O$) 49 of the partial RDRAM device 0a 48 is coupled to a termination 55 on the RDRAM RIMM. The termination couples the output to a termination voltage, typically through a resistive element such as a resistor (not shown).

It is important to note that due to the byte masking process used in RDRAM systems, signals directed along the data lines of the signal bus 56 are associated with either the first group of data lines (0–7) or the second group of data lines (8–15). Signals associated with the first group of data lines (0–7) must be received by one of the RDRAM terminals DQ0–7, and signals associated with the second group of data lines (8–15) must be received by one of RDRAM terminals DQ8–15. Thus, for example, a system having any of RDRAM terminals DQ8–15 connected to any of data lines 0–7 may not function properly. Similarly, a system having any of RDRAM terminals DQ0–7 connected to any of data lines 8–15 may not function properly.

As will be clear to one of skill in the art, the invention described herein is not limited to substituting only two partially defective RDRAM devices for one non-defective RDRAM device. In theory, though it may become impractical at some point due to space or "real estate" restrictions on the carrier substrate for the RIMM, one could use any number of partially defective RDRAM devices up to the number of data lines available (for the embodiment shown in FIG. 6, 16 data lines) to simulate a single non-defective RDRAM device by placing them each in parallel, programmed with the same device ID, and each connected to distinct data lines. Additionally, a plurality of RIDRAM devices could be used to simulate each of the fully operational RIDRAM devices required for a given application. Presently, it is most preferred to use only two partially defective RDRAM devices to simulate each of any number of non-defective RDRAM devices in a RDRAM RIMM.

Figure 7:
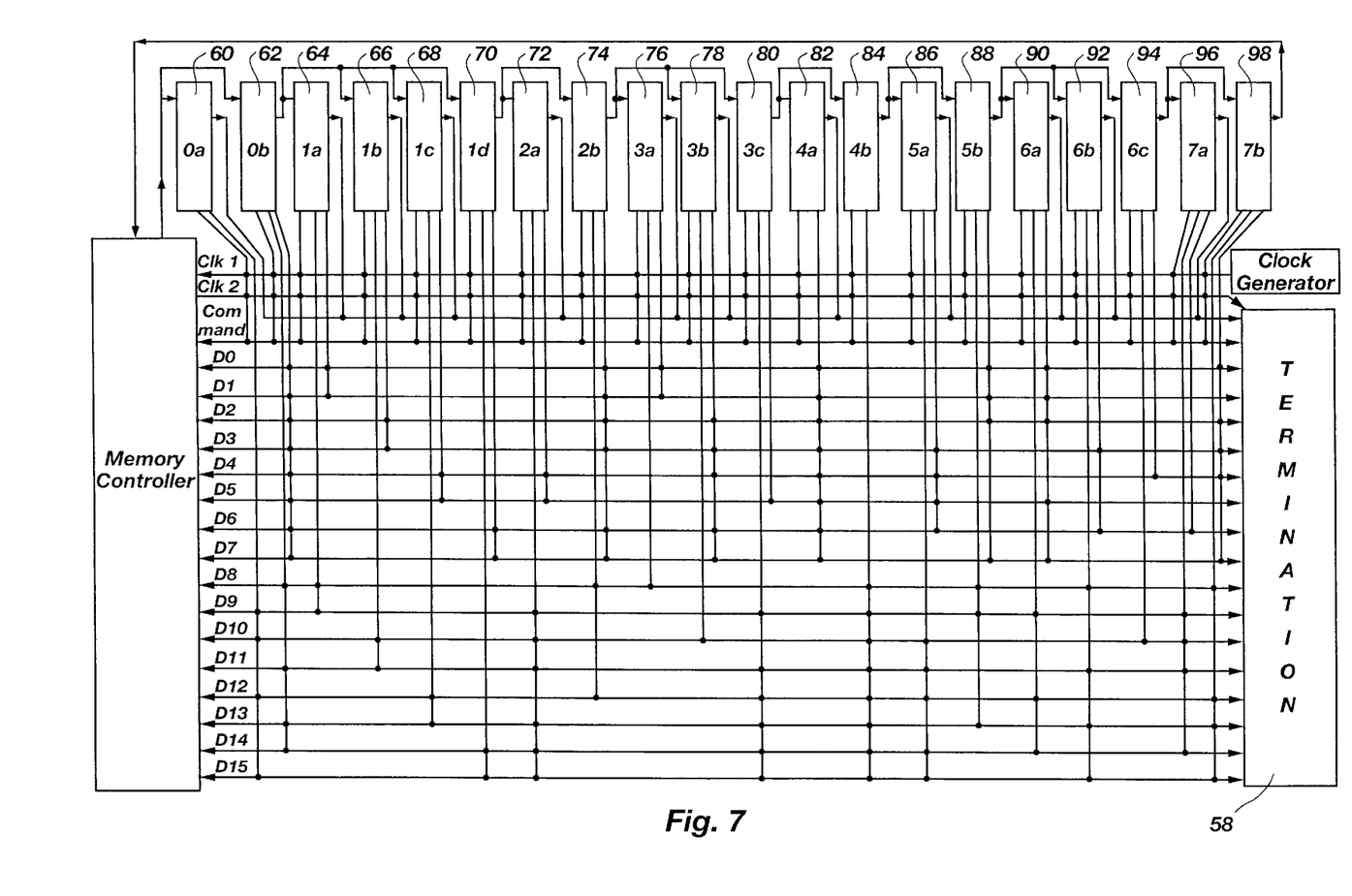
FIG. 7 is a block diagram of a computer memory system employing partially defective RDRAM devices in another embodiment of the present invention.

By example, however, to show the versatility of the invention in accommodating partially defective chips with a variety of configurations, FIG. 7 depicts an example in which an RDRAM RIMM with memory capacity equivalent to that of eight non-defective RDRAM devices is formed using 20 partially defective RDRAM devices 60–98. In this embodiment, a combination of either two, three or four partially defective RDRAM devices having various numbers of non-defective DQ connectors ranging from one to fifteen non-defective DQ connectors simulates the function of each non-defective RDRAM device. As should be clear by the embodiment shown in FIG. 7, the number of data lines to which a particular RDRAM device is connected will depend upon the number of non-defective DQ connectors. It should be understood, however, that not every non-defective DQ connector need be used for a particular partially defective RDRAM device. Furthermore, although the embodiment in FIG. 6 shows 16 available data lines, up to 18 data lines are presently common on RDRAM devices, and more could be adapted for use with this invention by one of ordinary skill in the art.

Regardless of how many data lines are available, a combination of partially defective RDRAM devices with at least the appropriate number of non-defective DQ connectors having appropriate data associations may be used to simulate an equivalent of a non-defective RDRAM device. To do so, the partially defective RDRAM devices used to simulate a single non-defective RDRAM device are connected to the signal bus in parallel such that at least one non-defective DQ connector having an appropriate data association (0–7 or 8–15) is coupled to each data line, coupled by their respective serial data inputs to a common serial data signal line and assigned the same device ID number. For all but one of the partially defective RDRAM devices used to simulate a single non-defective RDRAM device, the serial data outputs are coupled to a termination 58. For the remaining partially defective RDRAM serial data output not coupled to a termination, it is coupled to the next sequential RDRAM serial data input. If there are multiple sets of partially defective RDRAM devices, each set simulating a single non-defective RDRAM device, each set is similarly coupled to the system.

It will be understood by one of skill in the art that the way in which specific defective or otherwise unused DQ connectors are placed out of communication with, or electrically isolated from, the data lines on the system bus may vary. Such electric isolation includes not only physical isolation through a fuse, an anti-fuse, or a lack of electrical path, but also includes electric isolation by software programming. In one embodiment of the present invention, the circuit traces or other conductive communication lines (including any electrical connections) on the module carrier substrate (such as a printed circuit board) are not configured to connect the defective DQ connectors to the data lines through a system interface. In another embodiment, the defective DQ connectors for each RDRAM device are taken out of communication with the data line by fusable devices such as fuses or anti-fuses coupled to each DQ connector to break such communication links to the RDRAM device. Fuses and anti-fuses are commonly used in semiconductor applications and are well known in the art. There are also other ways to restrict or prevent communication between the defective DQ connectors and the data lines which will be clear to those of skill in the art. Most preferably, however, for the present invention, communication to defective DQ connectors and data lines is prevented by lack of a conductive trace on the printed circuit board extending to the defective DQ connector.

Figure 8:
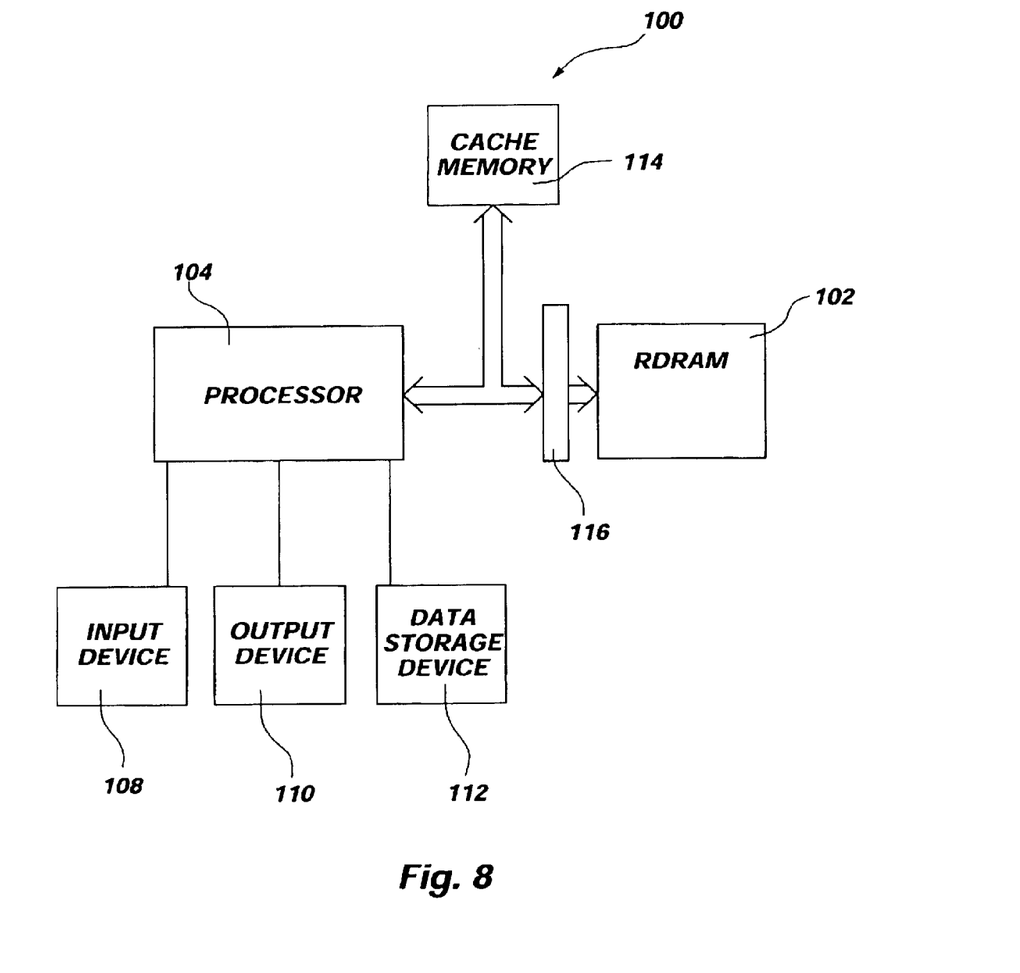
FIG. 8 is a block diagram of a computer system employing partially defective RDRAM devices according to the present invention.

FIG. 8 is a block diagram of a computer system 100 which includes RDRAM 102 comprising at least two partially defective RDRAM devices. The computer system 100 includes a processor 104 for performing various computing functions, such as executing specific software to perform specific calculations or tasks. In addition, the computer system 100 includes one or more input devices 108, such as a keyboard or a mouse, coupled to the processor 104 to allow an operator to interface with the computer system 100. Typically, the computer system 100 also includes one or more output devices 110 coupled to the processor 104, such output devices typically being a printer, a video terminal or a network connection. One or more data storage devices 112 are also typically coupled to the processor 104 to store data or retrieve data from external storage media (not shown). Examples of typical storage devices 112 include hard and floppy disks, tape cassettes, and compact disks. The processor 104 is also typically coupled to a cache memory 114, which is usually static random access memory ("SRAM"), and to a chipset 116 which acts as an interface between the processor 104 and the RDRAM 102.

Although the present invention has been shown and described with respect to preferred embodiments, various additions, deletions and modifications that are obvious to a person skilled in the art to which the invention pertains, even if not shown or specifically described herein, are deemed to lie within the scope of the invention as encompassed by the following claims.

What is claimed is:

1. A memory module comprising at least two partially defective RDRAM devices, each having at least partially complementary defects and each programmed with the same device ID, wherein the at least two partially defective RDRAM devices, in combination, comprise a fully functional RDRAM.

2. The memory module of claim 1, wherein each of the at least two partially defective RDRAM devices comprises at least one non-defective DQ connector, and each at least one non-defective DQ connector of the at least two partially defective RDRAM devices corresponds to a discrete data line.

3. The memory module of claim 1, wherein each of the at least two partially defective RDRAM devices comprises at least one DQ connector corresponding to a discrete data line, the memory module further comprising at least one electrical isolating means associated with each at least one DQ connector and configured to disrupt communication therethrough from an associated RDRAM device to the discrete data line.

4. The memory module of claim 3, wherein the at least one electrical isolating means is performed by software programming.

5. The memory module of claim 3, wherein the at least one electrical isolating means is a fusing device.

6. A computer memory system comprising:
a memory controller; and
at least two partially defective RDRAM devices, each having at least partially complementary defects and each programmed with the same device ID, wherein the at least two partially defective RDRAM devices, in combination, comprise a fully functional RDRAM.

7. The computer system of claim 6, wherein each of the at least two partially defective RDRAM devices comprises at least one non-defective DQ connector, and each at least one non-defective DQ connector of the at least two partially defective RDRAM devices corresponds to a discrete data line.

8. The computer system of claim 6, wherein each of the at least two partially defective RDRAM devices comprises at least one DQ connector corresponding to a discrete data line, the at least two partially defective RDRAM devices each further comprising at least one electrical isolating means associated with each at least one DQ connector and configured to disrupt communication therethrough from an associated RDRAM device to the discrete data line.

9. The computer system of claim 8, wherein the at least one electrical isolating means is performed by software programming.

10. The computer system of claim 8, wherein the at least one electrical isolating means is a fusing device.

11. A computer system comprising:
a processor;
at least one input device coupled to the processor and adapted to allow data to be input to the processor;
at least one output device coupled to the processor and adapted to allow the processor to output data;
at least one storage device coupled to the processor adapted to store information for use by the processor; and
a memory device coupled to the processor for storing data and instructions for use by the processor, the memory device comprising:
a memory module comprising at least two partially defective RDRAM devices, each having at least partially complementary defects and each programmed with the same device ID, wherein the at least two partially defective RDRAM devices, in combination, comprise a fully functional RDRAM.

12. The computer system of claim 11, wherein each of the at least two partially defective RDRAM devices comprises at least one non-defective DQ connector, and each non-defective DQ connector of the at least two partially defective RDRAM devices corresponds to a discrete data line.

13. The computer system of claim 12, wherein the non-defective DQ connectors are electrically isolated from any data line.

14. The computer system of claim 11, wherein each of the at least two partially defective RDRAM devices programmed with the same device ID further comprises a serial data output, the serial data output of a first of the at least two partially defective RDRAM devices being coupled to a serial data input of at least one partially defective RDRAM device is programmed with a different device ID.

* * * * *

UNITED STATES PATENT AND TRADEMARK OFFICE
CERTIFICATE OF CORRECTION

| | |
|---|---|
| PATENT NO. | : 6,810,492 B2 |
| APPLICATION NO. | : 10/430851 |
| DATED | : October 26, 2004 |
| INVENTOR(S) | : Richard R. Weber, Corey L. Larsen and James J. Howarth |

It is certified that error appears in the above-identified patent and that said Letters Patent is hereby corrected as shown below:

In the specification:
COLUMN 3, LINE 13, change "DRAM device 12" to --DRAM 12--
COLUMN 3, LINE 38, change "to the" to --at the--
COLUMN 4, LINE 20, change "Plaines." to --Plaines, Illinois.--

In the claims:
COLUMN 8, LINE 45, after "the" and before "non-" insert --at least one--
COLUMN 8, LINE 46, change "connectors are" to --connector is--
COLUMN 8, LINE 54, change "device is" to --device--

Signed and Sealed this

Sixth Day of November, 2007

JON W. DUDAS
*Director of the United States Patent and Trademark Office*